US006943395B2

(12) United States Patent
Oh et al.

(10) Patent No.: US 6,943,395 B2
(45) Date of Patent: Sep. 13, 2005

(54) PHASE RANDOM ACCESS MEMORY WITH HIGH DENSITY

(75) Inventors: Hyung-Rok Oh, Seongnam-si (KR);
Beak-Hyung Cho, Osan-si (KR);
Du-Eung Kim, Yongin-si (KR);
Woo-Yeong Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/805,696

(22) Filed: Mar. 22, 2004

(65) Prior Publication Data

US 2004/0245554 A1 Dec. 9, 2004

(30) Foreign Application Priority Data

Jun. 4, 2003 (KR) .............................. 10-2003-0036089

(51) Int. Cl.[7] ............................................ H01L 29/76
(52) U.S. Cl. .............................. 257/295; 257/2; 257/3; 257/4; 315/101; 315/105; 315/163; 365/101; 365/102; 365/103; 365/104; 365/105; 365/163

(58) Field of Search ...................... 257/2, 3, 4; 315/101, 315/105, 163; 365/101–105, 163

(56) References Cited

U.S. PATENT DOCUMENTS 6,750,469 B2 * 6/2004 Ichihara et al. ................. 257/2

* cited by examiner

*Primary Examiner*—David Nelms
*Assistant Examiner*—Mai-Huong Tran
(74) *Attorney, Agent, or Firm*—F. Chau & Associates LLC

(57) ABSTRACT

A phase random access memory including a plurality of access transistors, each access transistor including a drain region, and a phase-changeable film shared by the plurality of access transistors. The phase-changeable film is connected to a bitline through a first electrode and connected to each respective drain region through at least one of a plurality of second electrodes.

20 Claims, 18 Drawing Sheets

PHASE RANDOM ACCESS MEMORY WITH HIGH DENSITY

This application relies for priority upon Korean Patent Application No. 2003-36089, filed on Jun. 4, 2003, the contents of which are herein incorporated by reference in their entirety.

FIELD OF THE INVENTION

The present disclosure relates to random accessible nonvolatile memories and, more specifically, to phase random access memories storing data in memory cells, each memory cell including an access transistor and a phase-changeable material film.

BACKGROUND OF THE INVENTION

Nonvolatile memories having higher integration density and larger storage capacity, and which are randomly accessible with address information, are increasingly regarded as important applications for mobile or mass storage devices. While known products for such nonvolatile memories are flash memories, there have been proposed other types, for example, ferroelectric random access memories (FRAM) using ferroelectric capacitors, magnetic RAMs (MRAM) using tunneling magneto-resistive films, and phase RAMs (PRAMs, phase-changeable RAMs, or chalcogenide-based RAMs) using chalcogenide alloys.

Specifically, the phase RAMs, which are capable of being fabricated with simple processing methods, provide larger storage capacity at lower cost, as well as the facilities of nonvolatile data retention. The phase RAMs are based on storage elements that use a class of materials which have the property of changing between two phases having distinct electrical characteristics. For instance, these materials may change from an amorphous, disorderly phase to a crystalline or polycrystalline, orderly phase, and the two phases are associated with considerably different values of resistivity.

At present, alloys of elements of group VI of the periodic table, such as Te (tellurium) or Sb (stibium), referred to as chalcogenides or chalcogenic materials, can be used in phase RAM cells. The chalcogenides that are widely used for storing data in overwrite disks are formed by a Ge (germanium), Sb and Te alloy (e.g., $Ge_2Sb_2Te_5$; referred to as GST). Other chalcogenic alloys besides the GSTs are As—Sb—Te, As-Gb-Te, In—Sn—Sb—Te, Ag—In—Sb—Te, 5A group material-Sb—Te, 6A group material-Sb—Te, and 5A group material-Sb—Se. Nitrogen may be added to these compounds.

A phase RAM unit memory cell UC, as shown in FIG. 1, is composed of a variable resistor C connected to a bitline BL, an NMOS access transistor M connected between the variable resistor C and a ground voltage (or substrate voltage). A gate of the access transistor is coupled to a wordline WL. The variable resistor C, as shown in FIGS. 2A and 2B, includes a chalcogenide film GST, a top electrode TEC and a bottom electrode BEC between which the GST film is interposed. The top electrode TEC is connectively led to the bitline BL through a bitline contact BC while the bottom electrode BEC, made of a conductive material (e.g., TiN), is connected to a drain D of the access transistor M through a contact plug (or heater plug) CP. A crystalline condition of the chalcogenide film GST forming the variable resistor C is changeable by the current supply time and amount of current supplied thereto. A current path through the variable resistor C is formed between the bitline BL and the ground voltage when the access transistor M is turned on responding to an activation of the wordline WL.

The chalcogenide film material has two stable phases that are used to operate programming and erasing modes. As plotted by a curve 1 in FIG. 3, the chalcogenide material changes to an amorphous state if it is heated up above the melting temperature Tm (approximately 600° C.) for a time T1 and then quenched rapidly, which is referred to as a program (or reset) state for storing data "1". As shown by a curve 2 in FIG. 3, the chalcogenide material moves to a crystalline state when it is quenched rapidly after it is heated to a temperature between the melting temperature Tm and the crystallization temperature Tc (approximately 450° C.) for a time T2 longer than T1, which is referred to as an erase (or set) state for storing data "0".

Using the condition that an amorphous chalcogenide material has a relative resistance larger than that of a crystalline chalcogenide material, a voltage difference by a current passing through the variable resistor C determines data "1" or "0" in a read operation. A variable range of the relative resistivity in the chalcogenide material is about $10^3$.

FIG. 4 illustrates an example of a memory cell array arranged in matrix form including chalcogenide unit cells. As shown in FIG. 4, the memory cell array of a phase RAM, like that of dynamic RAM, is constructed of unit cells UC coupled to bitlines BL0~BLn-1 and wordlines WL0~WLm-1 in a matrix pattern. Although not shown, each of the bitlines may be coupled to sense amplifiers.

Phase RAMs having the memory cell arrays shown in FIG. 4 should be more integrated because they may be most applicable to portable electronic devices such as mobile phones or personal digital assistants (PDAs), which require higher storage capabilities within restricted circuit areas.

In addition to the high integration needs, it also required to enhance current density throughout the chalcogenide film GST, which is a phase-changeable material film of the variable resistor. Current density is enhanced by concentrating current intensity on a heat point PTA where the bottom electrode BEC contacts the chalcogenide film GST. To increase the current density in the chalcogenide film GST, a diameter of the contact plug CP that acts as a heat medium actuated by the current should be smaller and a channel width of the access transistor M should be wider. Such restrictions on structural implementation may cause increasing dimensions of memory cell arrays due to inevitably larger channel widths of the access transistors, resulting in enlargement of chip sizes of high performance and high density phase RAMs. A layout area for a unit cell of a phase RAM, e.g., 6~12F2, is wider that that of a normal DRAM. Therefore, there is a need to reduce the unit cell area in the phase RAM.

SUMMARY OF THE INVENTION

According to an embodiment of the present invention, there is provided a phase random access memory having a memory cell array arranged with a plurality of component areas. Each component area includes a first conductive line extending in a first direction, a plurality of second conductive lines extending in a second direction, a phase-changeable film electrically connected to the first conductive line, a first semiconductor region electrically connected to the phase-changeable film and defined within a first active region, and a second semiconductor region defined within a second active region and separated from the first semiconductor region.

Each of the component areas may further include a first electrode connecting the first conductive line to the phase-changeable film, a second electrode connecting the phase-changeable film to the first semiconductor region; and a third electrode connecting the phase-changeable film to the second semiconductor region. Each of the component areas may further include a bitline contact through which the phase-changeable film electrically connects to the first conductive line, the bitline contact being shared by drain regions for each of a plurality of access transistors. Each of the component areas may further include a plurality of third conductive lines extending in the second direction.

The first, second, and the third conductive lines are bitlines, wordlines, and ground lines, respectively.

The second and third electrodes may be arranged along the first direction or along the second direction.

In another embodiment of the present invention, a phase random access memory includes a bitline, a plurality of access transistors, each access transistor including a drain region, and a phase-changeable film shared by the plurality of access transistors.

The phase-changeable film may be connected to the bitline through a first electrode and connected to each respective drain region through at least one of a plurality of second electrodes. The plurality of access transistors may share the first electrode.

A source region of each access transistor may be connected to a respective ground line.

The drain and source regions of each access transistor may be defined within an active region. The active region may be divided into a plurality of regions isolated from each other. A source region of each access transistor may be commonly connected to a ground line. The ground line may be shared the source regions of each access transistor. The plurality of access transistors may share a source region.

The phase-changeable film may be connected to the bitline through a bitline contact shared by the drain region of each access transistor.

According to another embodiment of the present invention, a phase random access memory has a memory cell array arranged with a plurality of component areas. Each of the component areas includes a first conductive line extending in a first direction, a plurality of second conductive lines extending in a second direction, a plurality of phase-changeable films electrically connected to the first conductive line, and a semiconductor region electrically connected to the plurality of phase-changeable films, wherein at least one phase-changeable film of the plurality of phase changeable films is electrically connected to an adjacent semiconductor region of an adjacent component area.

The phase random access memory may further include a plurality of bitline contacts through which the plurality of phase changeable films are connected to the semiconductor region, wherein at least one bitline contact of the plurality of bitline contacts connects the at least one phase-changeable film to the adjacent semiconductor region.

The phase random access memory may also include a third conductive line, wherein at least one of third conductive line and the plurality of second conductive lines are twisted. The first conductive may be a bitline, each of the plurality of second conductive lines may be a wordline, and the third conductive line may be a ground line.

BRIEF DESCRIPTION OF THE DRAWINGS

Preferred embodiments of the invention can be understood in more detail from the following descriptions taken in conjunction with the accompanying drawings in which.

DETAILED DESCRIPTION OF THE PREFERRED EMBODIMENTS

Preferred embodiments of the present invention will now be described more fully hereinafter below in more detail with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Chalcogenide materials made of GST groups, e.g., $Ge_x$, $Sb_y Te_z$; $GeSb_4 Te_7$, $GeSb_2 Te_7$, or $Ge_2 Sb_2 Te_5$, may be used as phase-changeable materials forming the variable resistors (C) of the unit cells. However, the embodiments of the invention are not limited as such and other phase-changeable materials, e.g., Ag—In—Sb—Te, can be used in the unit cell of the phase RAM according to the embodiments of the present invention.

In the description of the embodiments of the present invention, "normal layout cell" refers to a group of unit cells. A plurality of normal layout cells are iteratively arranged in a matrix form of rows and columns on a layout plane of the phase RAM, wherein each normal layout cell is composed of two unit cells.

Figure 5:
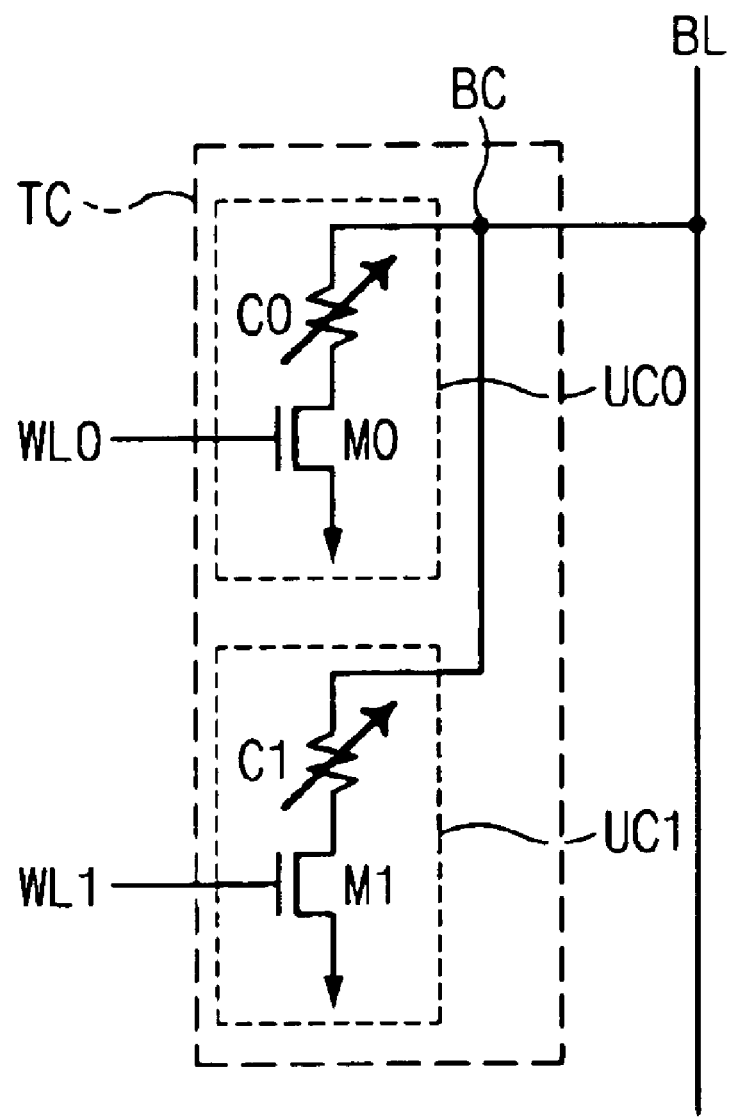
FIG. 5 is a circuit diagram of a normal layout cell composed of two unit cells.

FIG. 5 shows a circuit of the normal layout cell TC composed of two unit cells UC0 and UC1, as a unit layout element.

Referring to FIG. 5, the unit cells UC0 and UC1 are connected between the bitline BL and the ground voltage in parallel. The bitline BL is shared by the two unit cells UC0 and UC1 which are included in the normal layout cell TC. A gate of an access transistor M0 of the unit cell UC0 is coupled to a wordline WL0 while a gate of an access transistor M1 of the unit cell UC1 is coupled to a wordline WL1.

Figure 6:
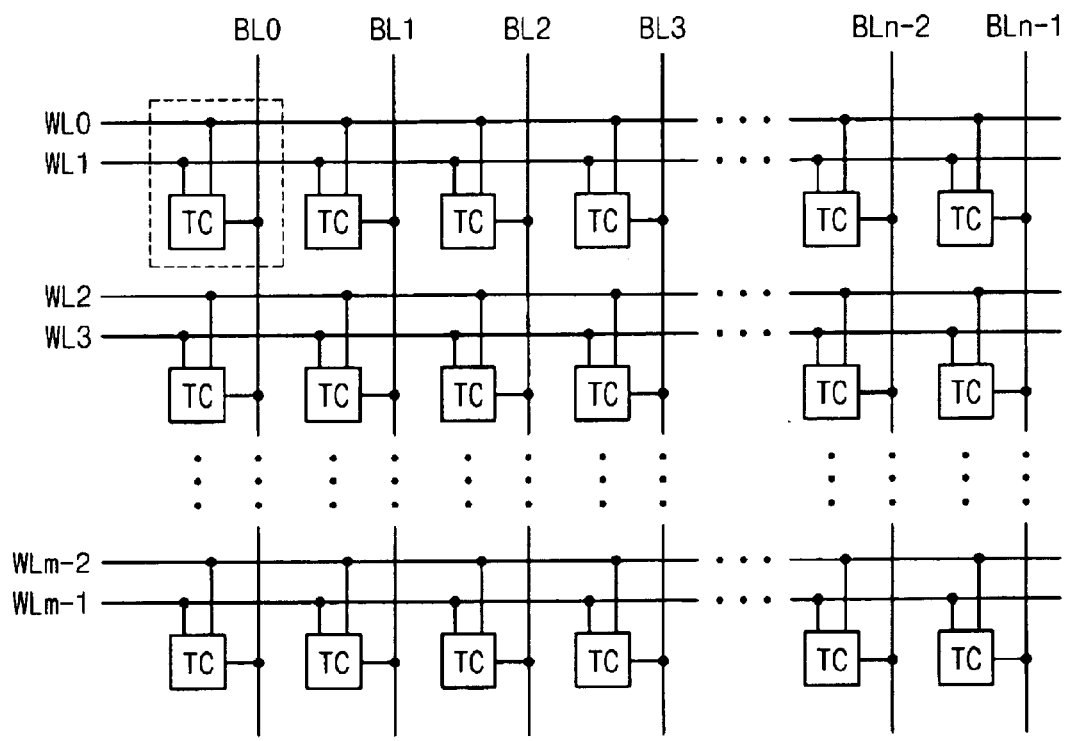
FIG. 6 is a circuit diagram illustrating a memory cell array with a plurality of normal layout cells.

FIG. 6 shows a circuit of a memory cell array including a plurality of normal layout cells like the normal layout cell TC shown in FIG. 5. As shown in FIG. 6, the normal layout cells TC are iteratively arranged on a matrix of rows and columns, wherein each normal layout cell TC is coupled to two wordlines and one bitline. The area enclosed by a broken line denotes a unit structure of the normal layout cell TC on a layout plane, which will be referred to explain the structural pattern of the normal layout cell according to the embodiments of the present invention, including a bitline BL0 and the wordlines WL0 and WL1 as an example.

Figure 7:
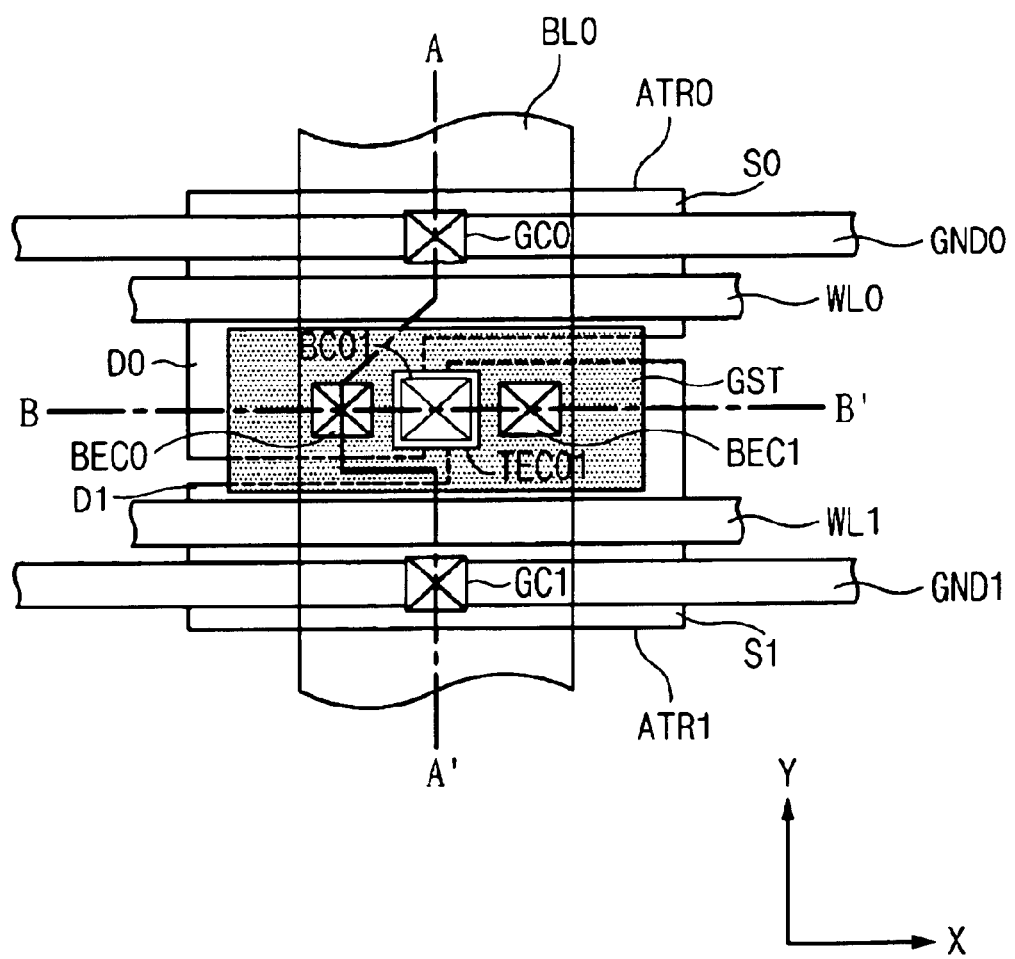
FIG. 7 is a plane diagram illustrating a structural pattern of the normal layout cell according to an embodiment of the invention.
Figure 8A:
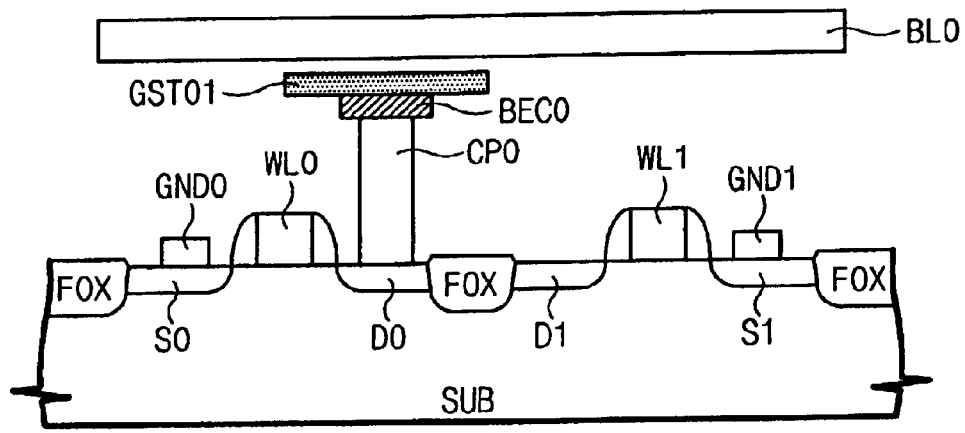
FIGS. 8A and 8B are sectional diagrams taken along the cutout lines A–A' and B–B' of FIG. 7, respectively.
Figure 8B:
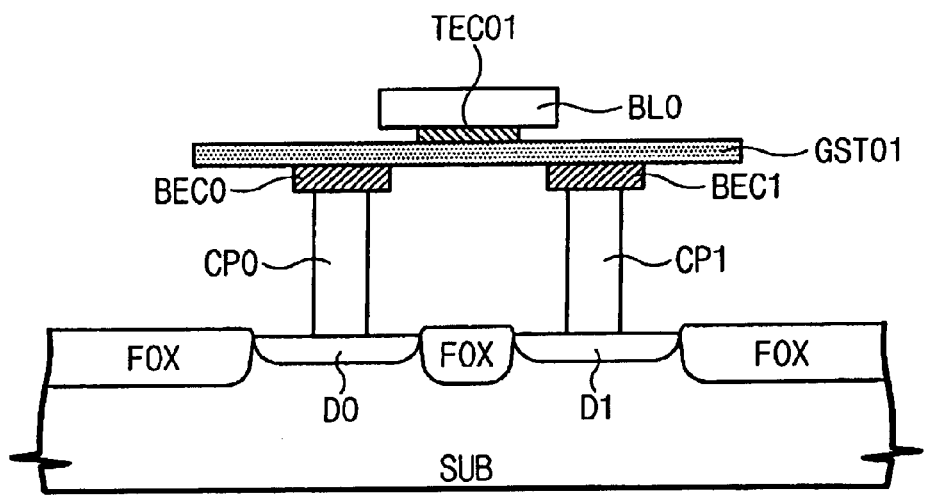

FIG. 7 shows a layout pattern of the normal layout cell TC, defined by the broken-line enclosed area of FIG. 6. FIGS. 8A and 8B show cross-sections along cutout lines A–A' (Y-axis) and B–B' (X-axis) of FIG. 7. The Y-axis is the direction of bitline extension while the X-axis is the direction of wordline extension.

Referring to FIG. 7, the unit cells UC0 and UC1 are arranged along the Y-axis or the extension direction of channel width. The access transistors M0 and M1 are formed in active regions ATR0 and ATR1 which are defined by a field isolation layer FOX (refer to FIGS. 8A and 8B). The active region ATR0 of the access transistor M0 includes drain and source regions, D0 and S0, while the active region ATR1 of the access transistor M1 includes drain and source regions, D1 and S1.

Here, a chalcogenide film GST01 is shared by the unit cells UC0 and UC1.

Bottom electrodes BEC0 and BEC1 respectively for the variable resistors C0 and C1 are formed on the bottom surface of the chalcogenide film GST01 (refer to FIG. 8A or 8B). Between the bottom electrode BEC0 and the drain region D0 is connected a contact plug CP0, and between the bottom electrode BEC1 and the drain region D1 is connected a contact plug CP1 (refer to FIG. 8B). The bottom electrodes BEC0 and BEC1 connected to the drain regions D0 and D1, respectively, are arranged along the X-axis in this embodiment. A top electrode TEC01, which is shared by the two unit cells (or the two variable resistors C0 and C1), is settled on the top surface of the chalcogenide film GST01 and is connected to the bitline BL0 through a bitline contact BC01. The bitline contact BC01 is designed to overlap the drain regions D0 and D1 so as to be shared by the drain regions D0 and D1.

The source regions S0 and S1 of the access transistors M0 and M1 are connected to ground voltage lines GND0 and GND1 through ground contacts GC0 and GC1, respectively. The ground voltage lines GND0 and GND1 extend along the X-axis. Accordingly, two normal layout cells TC positioned adjacent each other along the X-axis may share the same ground voltage lines such that the ground voltage lines commonly connect to the source regions of the adjacent normal layout cells.

The wordline WL0 as the gate of the access transistor M0 of the unit cell UC0 is arranged between the drain and source regions, D0 and S0, and extends along the X-axis, while the wordline WL1 as the gate of the access transistor M1 of the unit cell UC1 is arranged between the drain and source regions, D1 and S1, and also extends along the X-axis.

A plurality of such layout patterns shown in FIG. 7 are arranged in a matrix form along the X- and Y-axes to form the memory cell array of FIG. 6.

Figure 1:
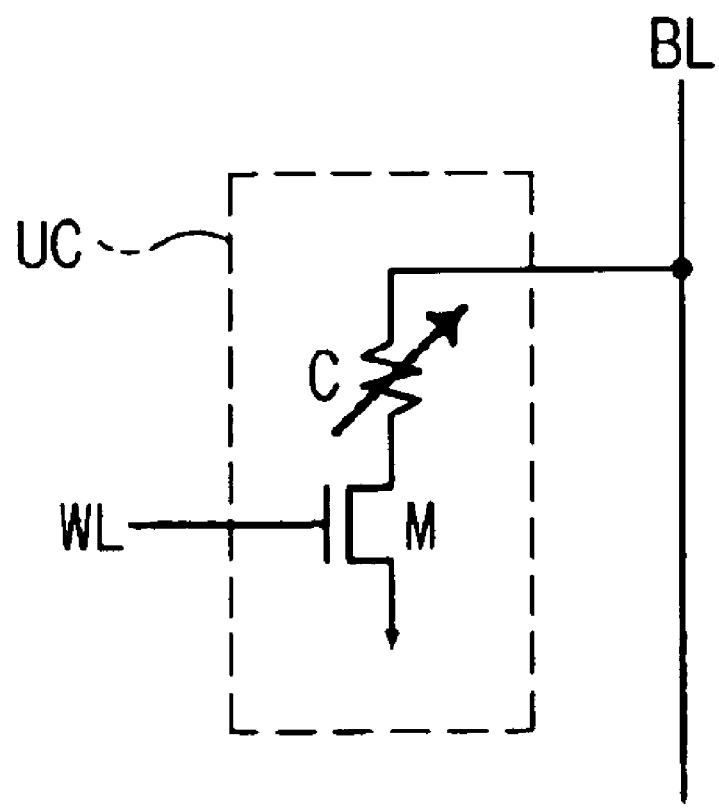
FIG. 1 is a circuit diagram of a unit cell of a phase random access memory.
Figure 2A:
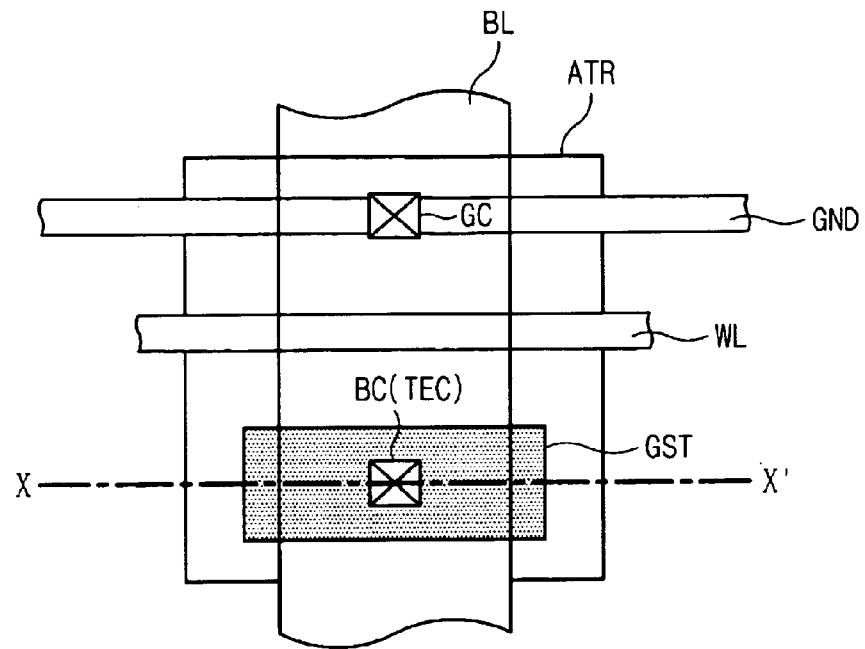
FIGS. 2A and 2B are top and sectional diagrams of the unit cell shown in FIG. 1.
Figure 2B:
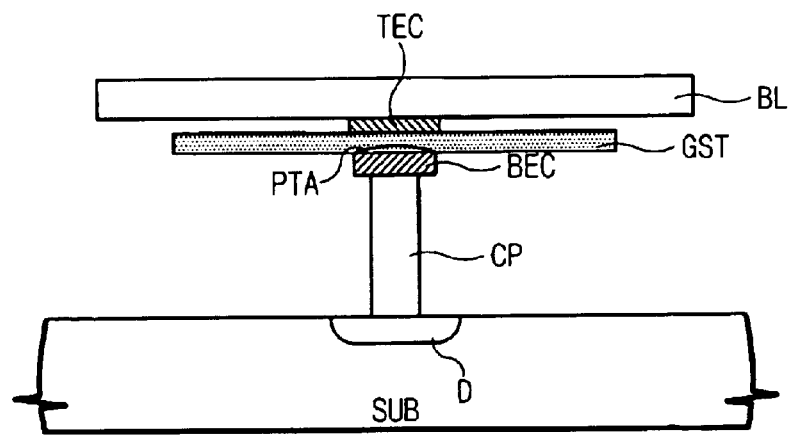
Figure 3:
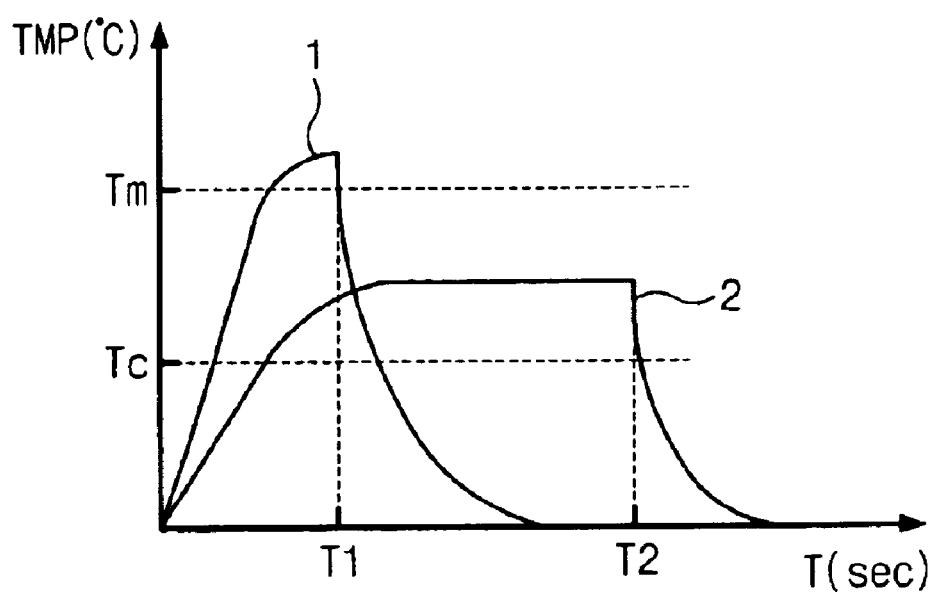
FIG. 3 is a graphic diagram showing the characteristics of phase-changeable material.
Figure 4:
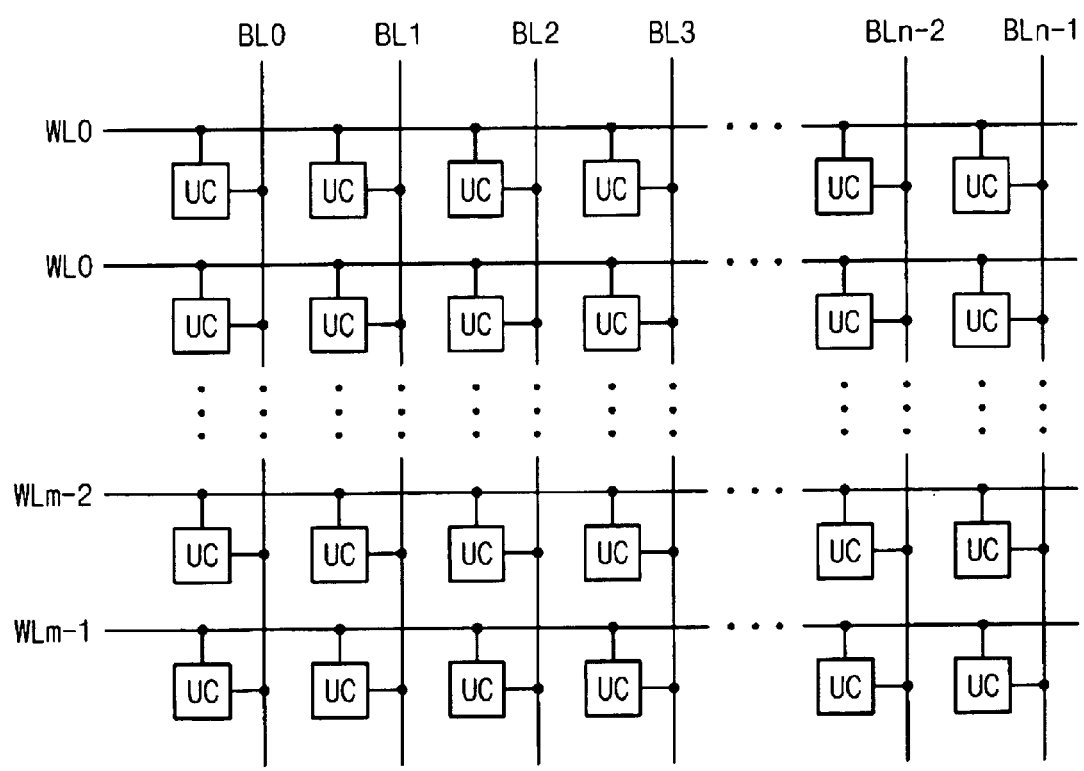
FIG. 4 is a circuit diagram illustrating a memory cell array with the unit cells shown in FIG. 1.

According to the embodiment shown in FIGS. 7 through 8B, the two access transistors M0 and M1 of the normal layout cell TC share the chalcogenide film GST01 and the top electrode TEC01 of the variable resistors C0, C1. As a result, it reduces an area as opposed to a structure wherein a chalcogenide film and a top electrode are independently provided for every unit cell. The distance between the bottom electrodes BEC0 and BEC1 may be established within the range of enabling the heat points PTA (refer to FIG. 2B), at which the bottom electrodes BEC0 and BEC1 contact to the chalcogenide film GST01, to be positioned independently. The phase change can occur at the heat points PTA.

While the embodiment shown in FIGS. 7 and 8A–8B arranges the bottom electrodes BEC0 and BEC1 along the X-axis (i.e., the wordline extension direction), the bottom electrodes BEC0 and BEC1 may be disposed along the Y-axis (i.e., the bitline extension direction), while interposing the bitline contact BC01 therebetween.

Figure 9:
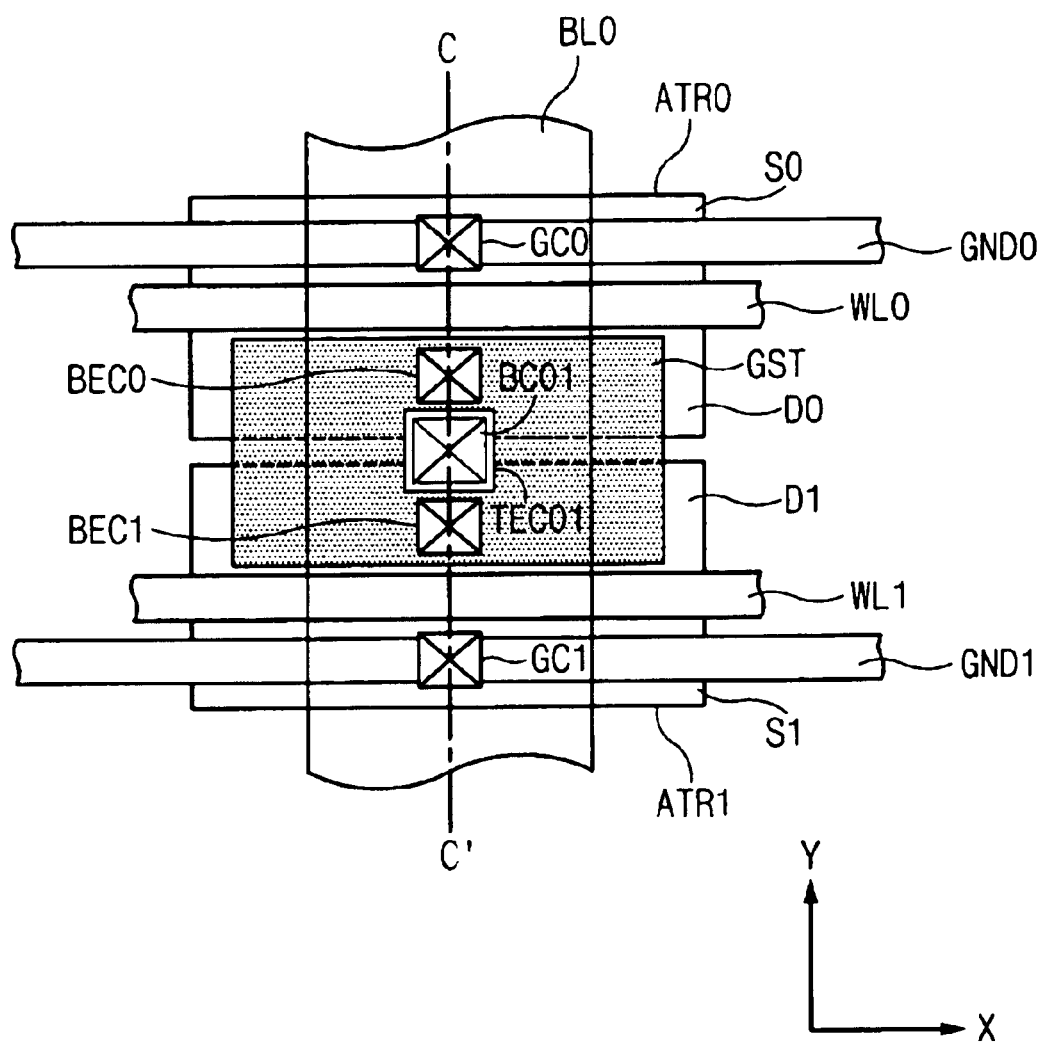
FIG. 9 is a plane diagram illustrating a structural pattern of the normal layout cell according to another embodiment of the invention.
Figure 10:
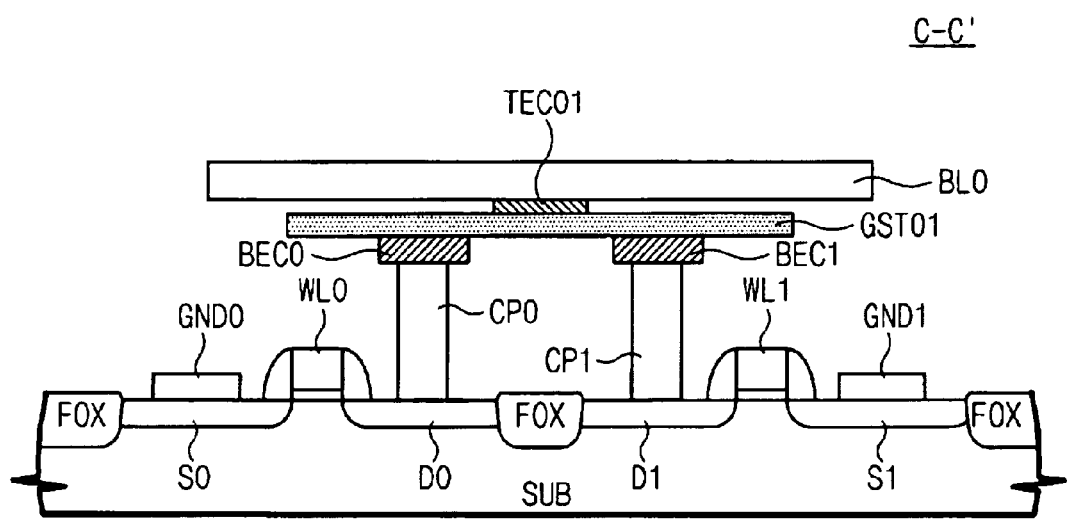
FIG. 10 is a sectional diagram taken along the line C–C' of FIG. 9.

FIG. 9 shows a layout pattern of the normal layout cell TC defined by the broken-line enclosed area of FIG. 6, according to another embodiment. FIG. 10 shows cross-sections along cutout line C–C' (the Y-axis) of FIG. 9.

Referring to FIGS. 9 and 10, the unit cells UC0 and UC1, included in the normal layout cell TC of FIG. 5, are arranged along the Y-axis (i.e., the direction of bitline extension or channel width). The access transistors M0 and M1 are formed in the active regions ATR0 and ATR1 separated by the field isolation layer FOX. The active region ATR0 of the access transistor M0 includes drain and source regions, D0 and S0, while the active region ATR1 of the access transistor M1 includes drain and source regions, D1 and S1.

Here, like the previous embodiment, the chalcogenide film GST01 is shared by the unit cells UC0 and UC1.

The bottom electrodes BEC0 and BEC1 respectively for the variable resistors C0 and C1 are formed on the bottom surface of the chalcogenide film GST01 (refer to FIG. 10). Between the bottom electrode BEC0 and the drain region D0 is connected the contact plug CP0, and between the bottom electrode BEC1 and the drain region D1 is connected the contact plug CP1. The bottom electrodes BEC0 and BEC1 connected to the drain regions D0 and D1, respectively, are arranged along the Y-axis in this embodiment, which is different from the previous embodiment. The top electrode TEC01, which is shared by the two unit cells (or the two variable resistors C0 and C1), is positioned on the top surface of the chalcogenide film GST01 and is connected to the bitline BL0 through a bitline contact BC01. The bitline contact BC01 is designed to overlap the drain regions D0 and D1 so as to be shared by the drain regions D0 and D1.

The source regions S0 and S1 of the access transistors M0 and M1 are connected to the ground voltage lines GND0 and GND1 through the ground contacts GC0 and GC1, respectively.

The wordline WL0 as the gate of the access transistor M0 of the unit cell UC0 is arranged between the drain and source regions, D0 and S0, and extends along the X-axis, while the wordline WL1 as the gate of the access transistor M1 of the unit cell UC1 is arranged between the drain and source regions, D1 and S1, and also extends along the X-axis.

A plurality of the layout patterns shown in FIG. 9 are arranged in a matrix form along the X- and Y-axes to form the memory cell array of FIG. 6.

According to the embodiment shown in FIGS. 9 through 10, the two access transistors M0 and M1 of the normal layout cell TC share the chalcogenide film GST01 and the top electrode TEC01 of the variable resistors C0, C1. As a result, it reduces an area as opposed to a structure wherein a chalcogenide film and a top electrode are independently provided for every unit cell. The distance between the bottom electrodes BEC0 and BEC1 may be established within the range of enabling the heat points PTA (refer to FIG. 2B), at which the bottom electrodes BEC0 and BEC1 contact the chalcogenide film GST01, to be positioned independently. The phase change can occur at the heat points PTA.

The present embodiment provides a margin for extending the channel width along the Y-axis, thereby enhancing the current density through the chalcogenide film.

The embodiments shown in FIGS. 7 and 9 may be fabricated by the same processing steps, except with respect to the positioning of the top electrode and the bottom electrodes.

The isolation of the drain regions of the access transistors prevent a current, which flows therein through the shared top electrode from the bitline during a read operation, from passing through the unit cells at the same time in the normal layout cell. The patterns for isolating the drain regions may be variably designed.

The normal layout cell TC also may be designed and fabricated such that the unit cells UC0 and UC1 share the ground lines and the source regions as well as the chalcogenide film.

Figure 11:
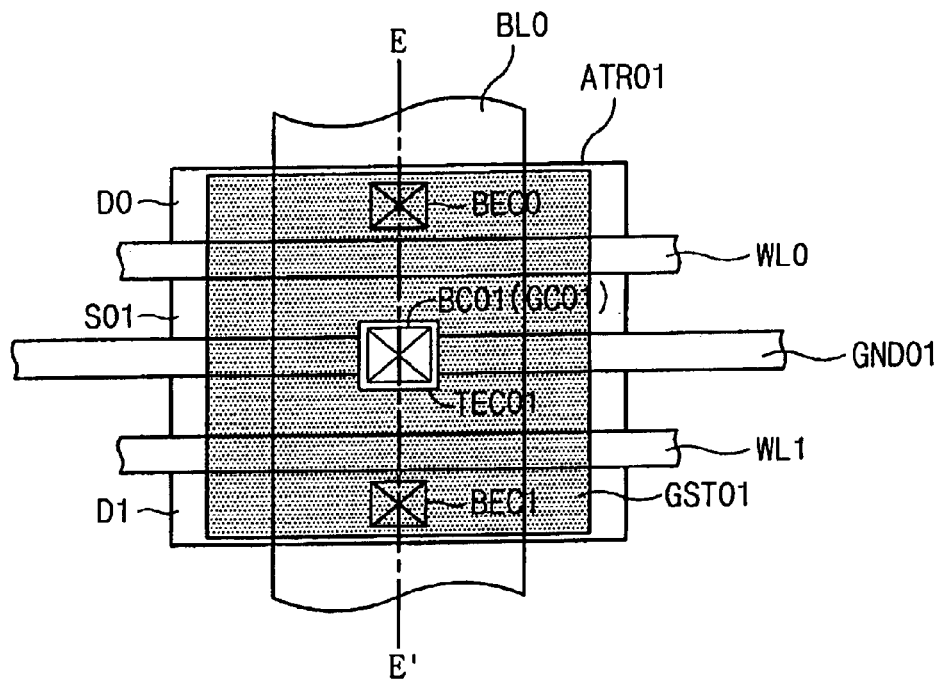
FIG. 11 is a plane diagram illustrating a structural pattern of the normal layout cell according to another embodiment of the invention.
Figure 12:
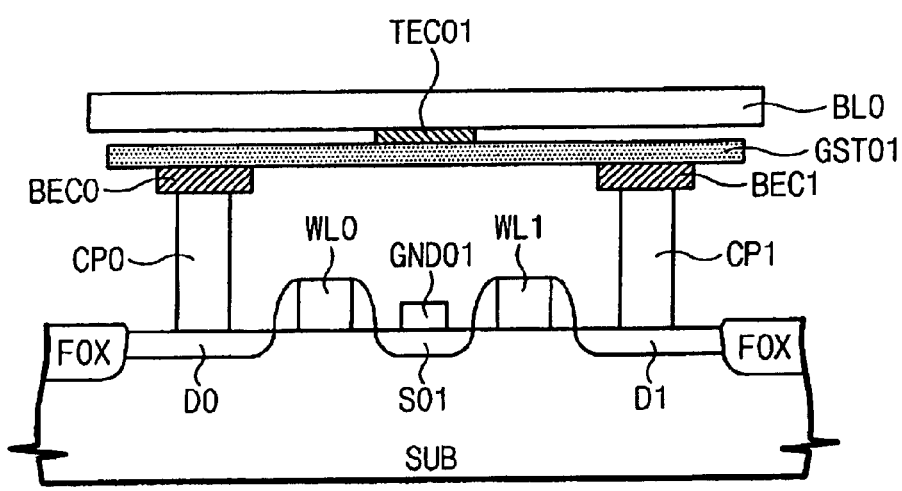
FIG. 12 is a sectional diagram taken along the line E–E' of FIG. 11.

FIG. 11 shows a layout pattern of the normal layout cell TC defined by the broken-line enclosed area of FIG. 6 according to another embodiment. FIG. 12 shows a cross-section along cutout line E–E' (the Y-axis) of FIG. 11.

Referring to FIG. 11, a source region S01 (corresponding to S0+S1 in the previous embodiments) is shared by the access transistors M0 and M1 of the unit cells UC0 and UC1, respectively. The shared source region S01 is defined in an active region ATR01. On the source region S01, a ground line GND01 is arranged extending along the X-axis, being shared by the access transistors M0 and M1.

The bottom electrodes BEC0 and BEC1, formed on a bottom surface of the chalcogenide film GST01 shared by the unit cells UC0 and UC1, are formed over the drain regions D0 and D1 of the access transistors M0 and M1, respectively. Between the bottom electrode BEC0 and the drain region D0 is connected the contact plug CP0, and between the bottom electrode BEC1 and the drain region D1 is connected the contact plug CP1. The contact plugs CP0 and CP1 act as heat plugs for the chalcogenide film GST01, and are formed from conductive materials such as Tin. The bottom electrodes BEC0 and BEC1 connected to the drain regions D0 and D1, respectively, are arranged along the Y-axis. The shared top electrode TEC01 of the shared chalcogenide film GST01 is positioned on the top surface of the chalcogenide film GST01 and is connected to the bitline BL1 through the shared bitline contact BC01.

The shared bitline contact BC01 is formed over a metal contact (or ground contact) GC01 that connects the shared ground line GND01 to the shared source region S01.

In this embodiment, the sharing of the ground line through the shared source region, as well as sharing of the chalcogenide film, enables the unit cell area to be reduced.

Figure 13A:
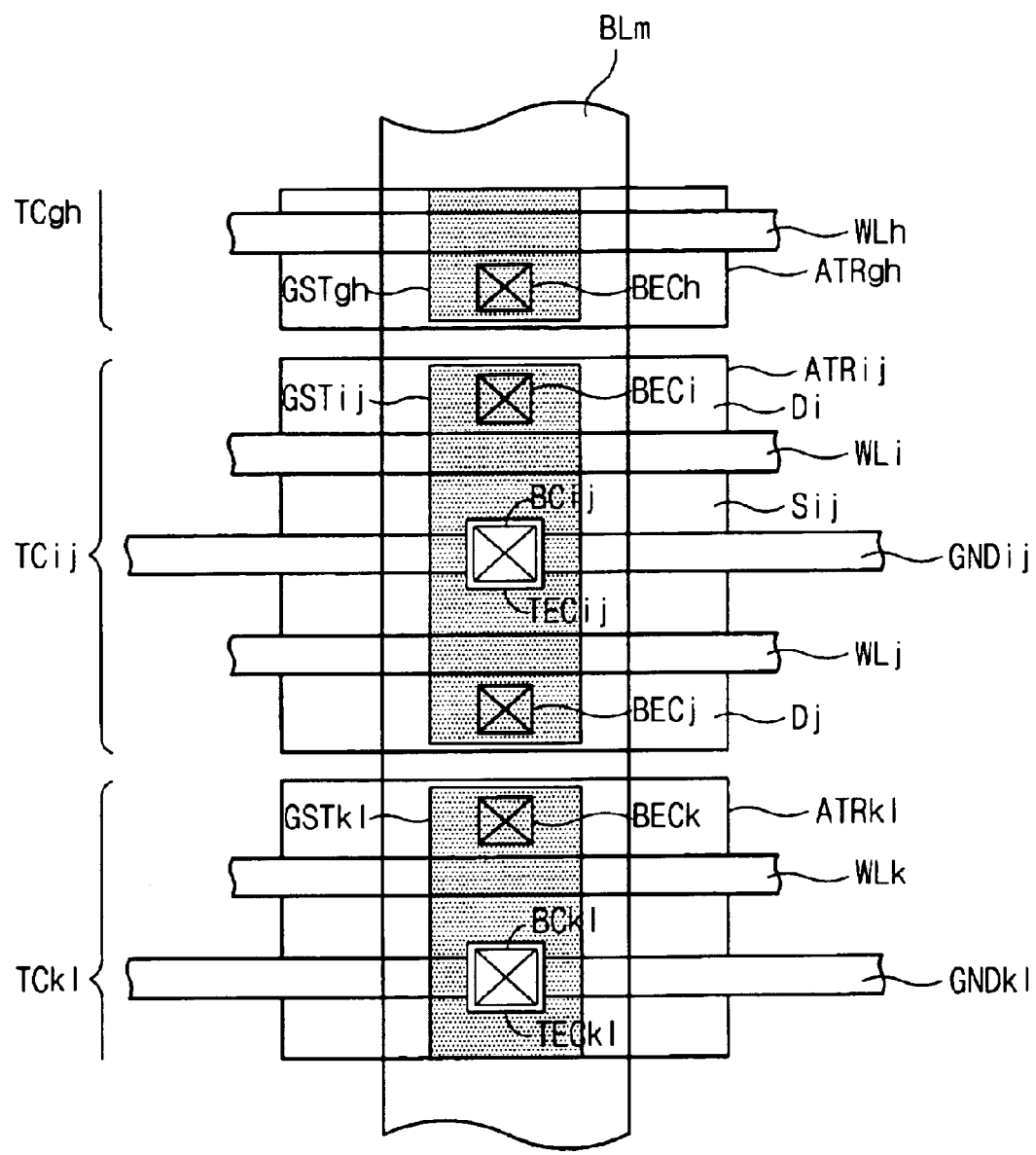
FIGS. 13A and 13B are plane diagrams illustrating memory cell arrays including a plurality of normal layout cells like the normal layout cell shown in FIG. 11, corresponding to a bitline.

FIG. 13A shows an enlarged layout pattern arranged with the normal layout cell structure shown in FIGS. 11 and 12, corresponding to a bitline (e.g., the m'th bitline BLm). In FIG. 13A, the normal layout cells, e.g., TCgh, TCij, and TCkl, are iteratively arranged along the bitline BLm.

Referring to FIG. 13A, the normal layout cell TCij is coupled to a shared ground line GNDij crossing a shared source region Sij in an active region ATRij corresponding thereto. A chalcogenide film GSTij assigned to the normal layout cell TCij is connected to the bitline BLm through a shared top electrode TECij at a bitline contact BCij. Bottom electrodes of the chalcogenide film GSTij, BECi and BECj, are connected to separated drain regions Di and Dj, respectively, through their contact plugs. Other cells adjacent to TCij, i.e., TCgh and TCkl, are also arranged in the same manner, reiteratively along the bitline BLm.

Figure 13B:
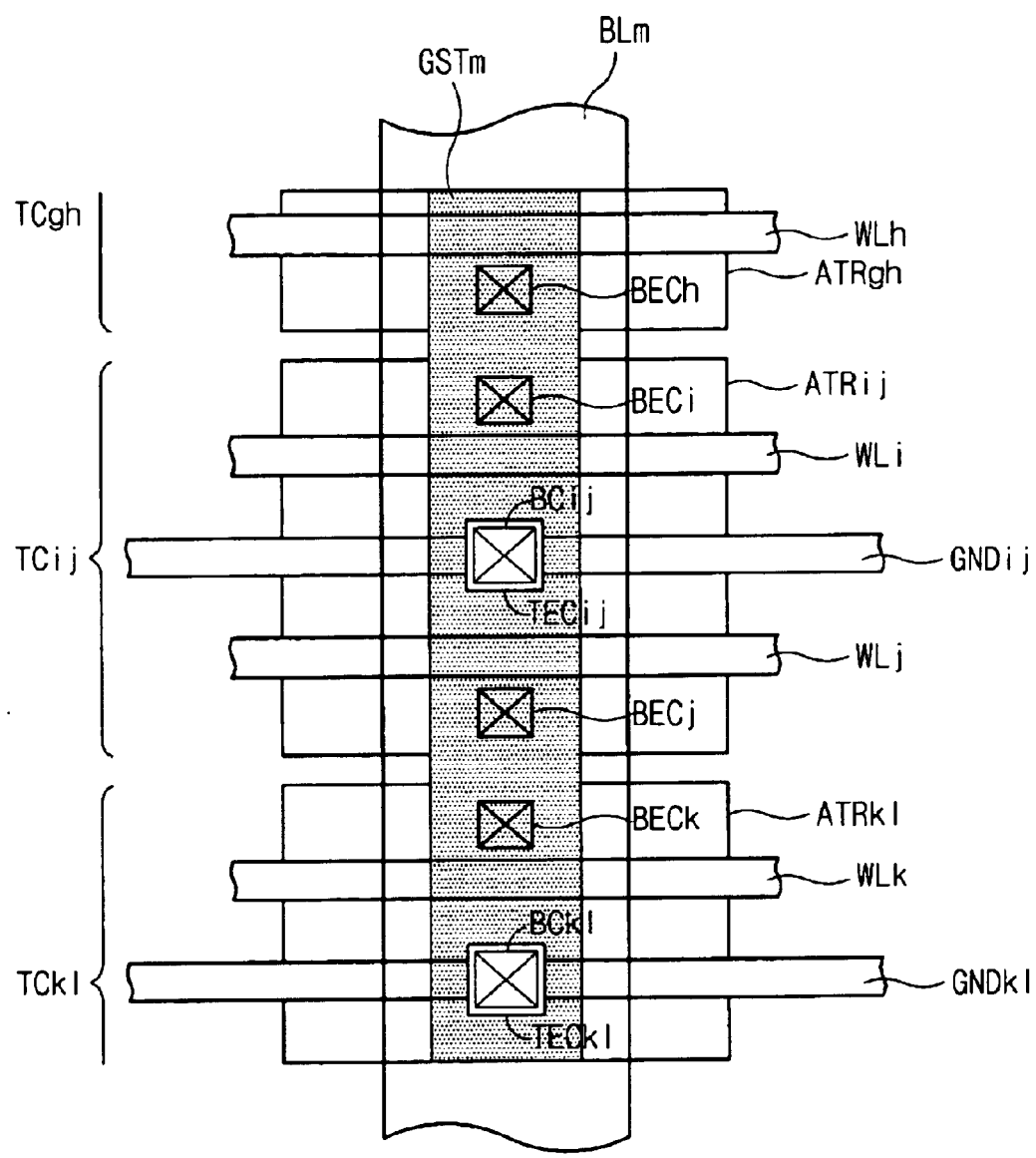

The layout pattern shown in FIG. 13B is different from that shown in FIG. 13A in that a chalcogenide film GSTm is shared by the normal layout cells, e.g., TCgh, TCij, and TCkl, which are arranged along the bitline BLm. That is, each bitline, e.g., BLm, is comprised of a single chalcogenide film. Bottom electrodes BECh, BECi, BECJ and BECk are formed under the shared chalcogenide film GSTm, being assigned respective to the unit cells (or the access transistors). Interconnection structures between the drain and source regions, the shared ground lines, and the top and bottom electrodes are the same as those of FIG. 13A.

According to the embodimentshown in FIG. 13B, an occupation area of the unit cell may be reduced because the normal layout cells belonging to one bitline share a single plate of the chalcogenide film as well as sharing the ground line. Such smaller unit cell areas as shown in FIGS. 13A and 13B contribute to reducing an overall area of the memory cell array. Moreover, the top electrodes of the normal layout cells reduce contact resistance against the bitline in the memory cell array as a whole.

The structure shown in FIG. 13B can enhance integration density and a phase transition to a crystalline or an amorphous state progresses uniformly at the heat points PTA during a current flow because a current from the bitline flows steadily around the bottom electrodes.

Figure 14:
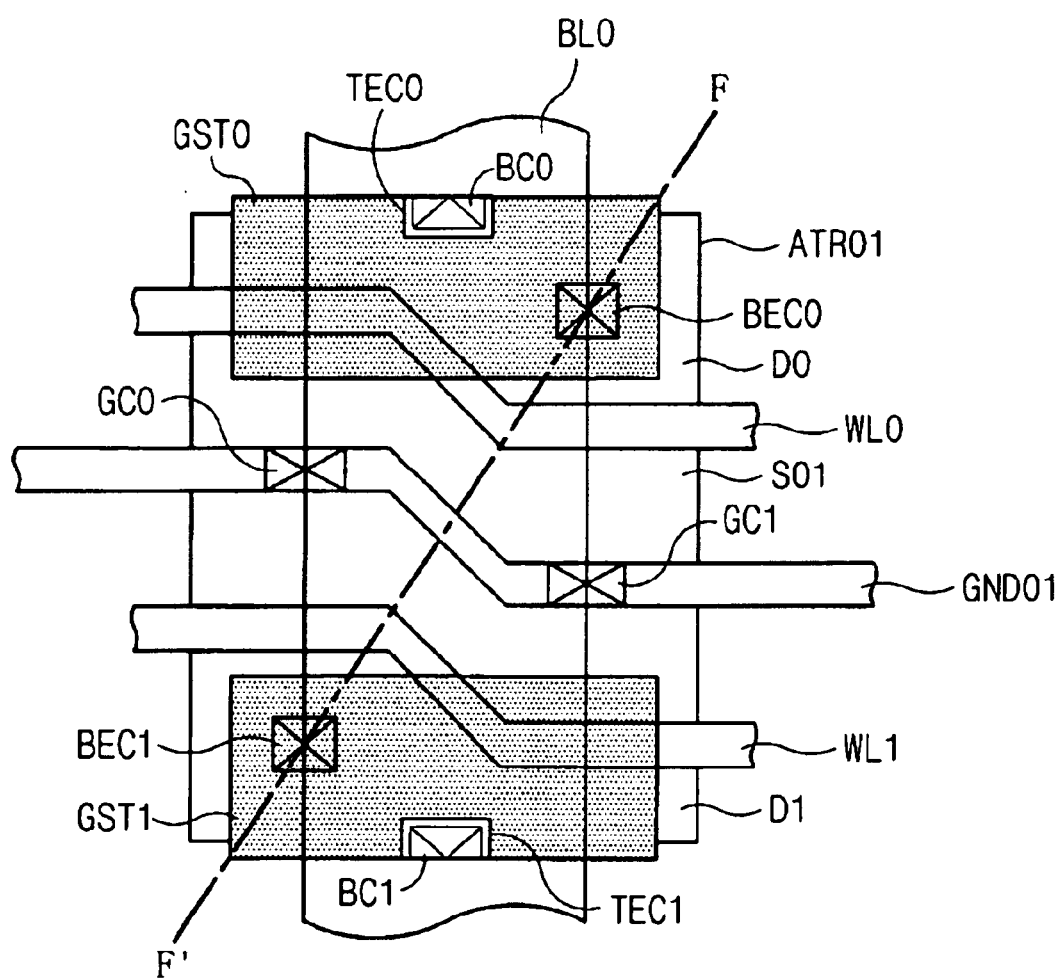
FIG. 14 is a plane diagram illustrating a structural pattern of the normal layout cell according to another embodiment of the invention.
Figure 15:
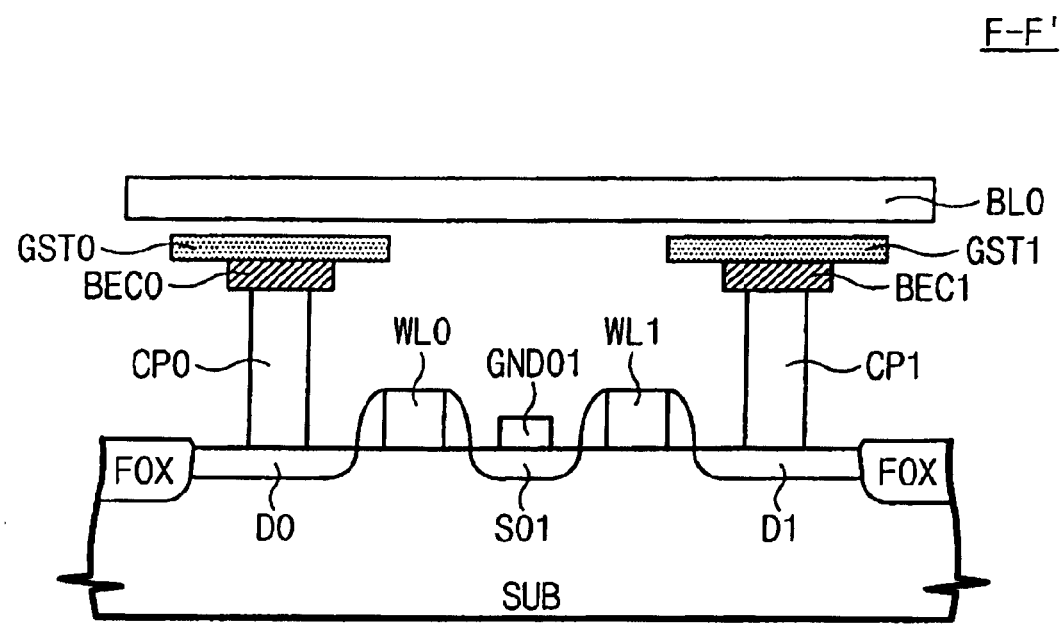
FIG. 15 is a sectional diagram taken along the line F–F' of FIG. 14.

FIG. 14 shows another embodiment of the normal layout cell, defined by the broken-line enclosed area of FIG. 6, wherein the source region and the ground line are shared. FIG. 15 shows a section along the cutout line F–F' of FIG. 14 and FIG. 16 illustrates a pattern of the memory cell array arranged with the normal layout cells shown in FIG. 14.

Referring to FIGS. 14 and 15, the chalcogenide films GST0 and GST1 are independently disposed respective to the unit cells UC0 and UC1 of the normal layout cell. Thus, top electrodes TEC0 and TEC1 are respectively formed at bitline contacts BC0 and BC1 which are each assigned to the unit cells. Respectively, the chalcogenide films GST0 and GST1 are connected to the drain regions D0 and D1 through the contact plugs CP0 and CP1, and the bottom electrodes BEC0 and BEC1.

Figure 16:
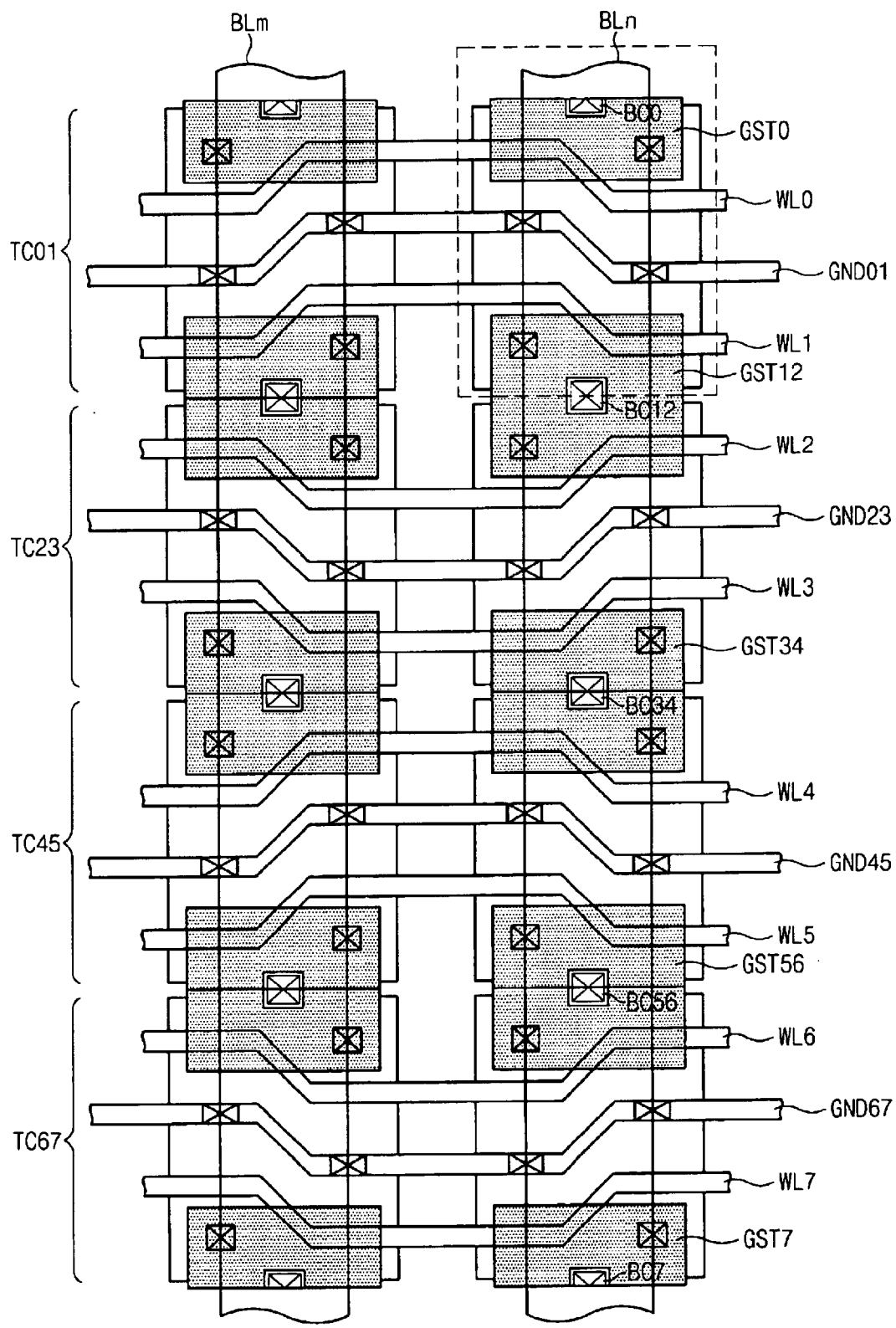
FIG. 16 is a plane diagram illustrating a memory cell array including a plurality of normal layout cells like the normal layout cell shown in FIG. 14, corresponding to two bitlines.

It should be noticed that while the chalcogenide films GST0 and GST1 are not shared by the unit cells within the normal layout cell (e.g., TC01) corresponding thereto, as shown in FIG. 16, each chalcogenide film (e.g.,GST1) is shared by the adjacent normal layout cell (e.g., TC23). Accordingly, the shared chalcogenide films between normal layout cells are referred to as GST12, GST34, and GST56 in FIG. 16. Similarly, bitline contacts are also shared between adjacent normal layout cells and are referred to as BC12, BC34, and BC56 in FIG. 16. The chalcogenide film GST0 and the bitline contact BC0 are shown as not being shared because the normal layout cell TC01 is the first normal layout cell of the bitline. In accordance with the sharing patterns according to the present embodiment, the bitline contacts are laid between the boundaries of the normal layout cells so that top electrodes from adjacent normal layout cells share a bitline contact. Therefore, each bitline contact (e.g., BC1) within the normal layout cell occupies half the size of previous embodiments.

Sharing of chalcogenide films and the bitline contacts by the adjacent normal layout cells provides improvements and flexibility with respect to high integration densities.

Referring to FIG. 14, the wordlines WL0 and WL1 and the shared ground line GND01 are shaped in twisted forms within a portion of the active region ATR01, and extendalong the X-axis. The ground contacts GC0 and GC1, which connect the shared ground line GND01 to the shared source region S01, are disposed with a predetermined distance from each other, wherein the twisted portion of the ground line GND01 is positioned between the ground contacts GC0 and GC1.

In FIG. 16, the part enclosed by a broken line represents the unit of iterative arrangement in the memory cell array, corresponding to FIG. 14.

Referring to FIG. 16, the adjacent normal layout cells share a chalcogenide film and a bitline contact. For instance, along the bitline BLn, normal layout cells TC01 and TC23, adjacent to each other, share the chalcogenide film GST12 and the bitline contact BC12. The adjacent normal layout cells TC23 and TC45 share the chalcogenide film GST34 and the bitline contact BC34. Also, the adjacent normal layout cells TC45 and TC67 share the chalcogenide film GST56 and the bitline contact BC56. A similar structure is formed along the bitline BLm.

Figure 17:
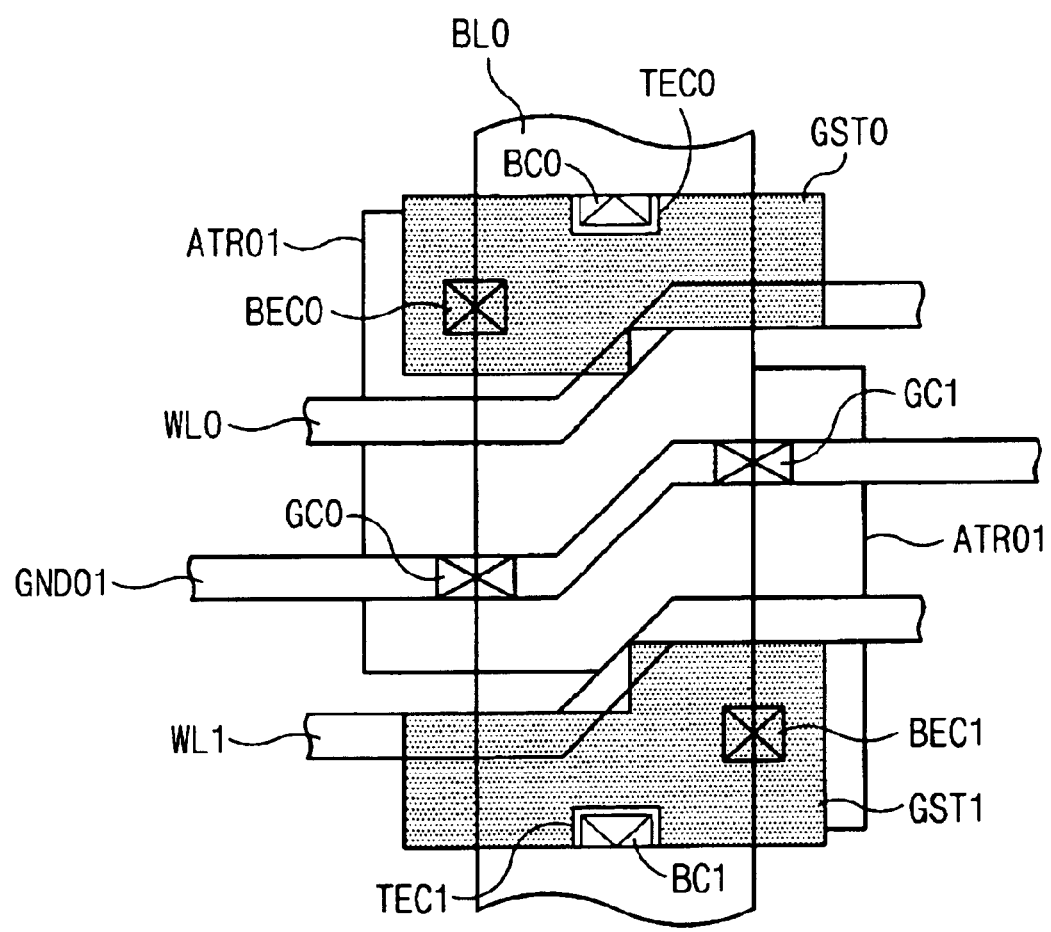
FIG. 17 is a plane diagram illustrating a structural pattern of the normal layout cell according to another embodiment of the invention.

FIG. 17 shows another embodiment of the pattern of the normal layout cell based on the structure of FIG. 14, wherein the structure of the chalcogenide film and the active region are modified. Like the embodiment described in connection with FIGS. 14–16, the source region and the ground line are shared.

Figure 18:
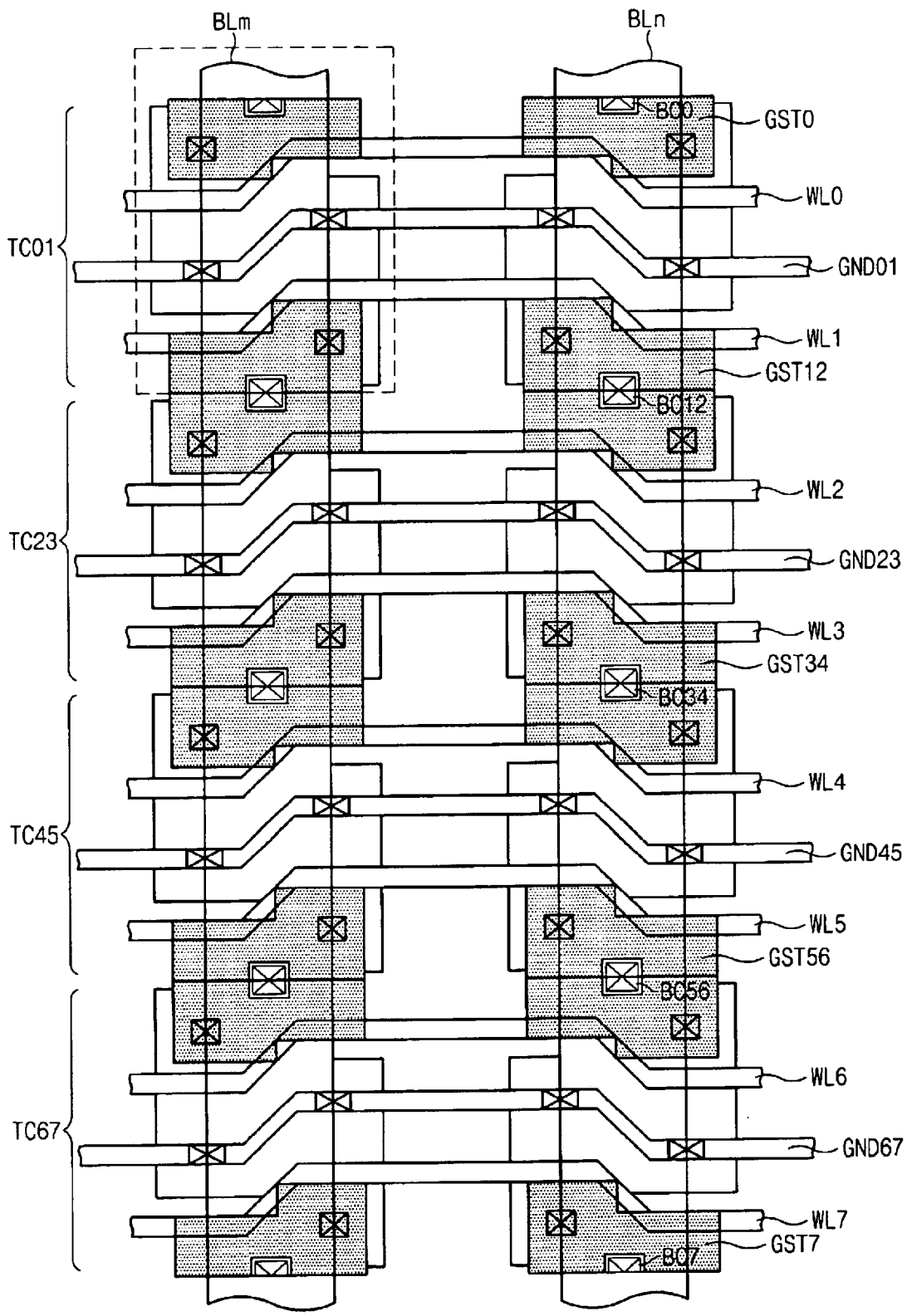
FIG. 18 is a plane diagram illustrating a memory cell array including a plurality of normal layout cells like the normal layout cell shown in FIG. 17, corresponding to two bitlines.

A section of the structure shown in FIG. 17 is similar to that of FIG. 15 and FIG. 18 shows a memory cell array pattern composed of the normal layout cells shown in FIG. 17.

Referring to FIG. 17, a pattern of the active region ATR01 is defined in a bended form like an "S"shape. The chalcogenide films GST0 and GST1 are disposed respective to the unit cells UC0 and UC1. The patterns of the chalcogenide films GST0 and GST1 are polygonal shapes, and mirror each other in antithetic symmetry form on the shared ground line GND01. The patterns of the chalcogenide films and active regions offer flexible and efficient options when designing a memory cell array layout and are not limited to the design of FIG. 17, whereby varied patterns are available according to specific design environments.

The remaining structural patterns not including the active region ATR01 and the chalcogenide films GST0 and GST1 are the same or similar to those of FIG. 14. The top electrodes TEC0 and TEC1 are respectively formed at the bitline contacts BC0 and BC1 which are each assigned to the unit cells. Respectively, the chalcogenide films GST0 and GST1 are connected to the drain regions D0 and D1 through the contact plugs CP0 and CP1, and the bottom electrodes BEC0 and BEC1.

Also, like the embodiment described in connection with FIGS. 14 through 16, each chalcogenide film (e.g., GST1) is shared by the adjacent normal layout cell (e.g., TC23). The chalcogenide film GST0 is illustrated as not being shared because the normal layout cell TC01 is set as the first normal layout cell from the beginning of the bitline. In accordance with the modified sharing patterns, the bitline contacts are laid between the boundaries of the normal layout cells so that top electrodes from adjacent normal layout cells share the bitline contact. Therefore, each bitline contact (e.g., BC1) within the normal layout cell occupies half the size.

Sharing the chalcogenide films and the bitline contacts by the adjacent normal layout cells provides further improvements and flexibilities for high integration densities.

As shown in FIG. 17, the wordlines WL0 and WL1 and the shared ground line GND01 are shaped in twisted forms within a portion of the active region ATR01, and extend along the X-axis. The ground contacts GC0 and GC1, which connect the shared ground line GND01 to the shared source region S01, are disposed with a predetermined distance from each other, such that the twisted portion of the ground line GND01 is interposed between the ground contacts GC0 and GC1.

In FIG. 18, the part enclosed by a broken line is the unit of iterative arrangement in the memory cell array, corresponding to FIG. 17.

Like in FIG. 16, the adjacent normal layout cells shown in FIG. 18 share a chalcogenide film and a bitline contact. For instance, along the bitline BLn, normal layout cells TC01 and TC23, adjacent to each other, share the chalcogenide film GST12 and the bitline contact BC12. The adjacent normal layout cells TC23 and TC45 share the chalcogenide film GST34 and the bitline contact BC34. Also, the adjacent normal layout cells TC45 and TC67 share the chalcogenide film GST56 and the bitline contact BC56. A similar structure is formed along the bitline BLm.

As mentioned above, the present invention provides advanced layout morphologies for implementing high density phase RAMs, which enables expansion of storage capacities of phase RAMs within a restricted chip area.

While the embodiments show a normal layout cell composed of two unit cells, it may be possible to increase the number of unit cells included the normal layout cells under the practical conditions of designing. In addition, other phase-changeable materials may substitute for the chalcogenide films of the variable resistors of the unit cells.

Although the illustrative embodiments have been described herein with reference to the accompanying drawings, it is to be understood that the present invention is not limited to those precise embodiments, and that various other changes, modifications, additions and substitutions may be affected therein by one of ordinary skill in the related art without departing from the scope and spirit of the invention. All such changes and modifications are intended to be included within the scope of the invention as defined by the accompanying claims.

What is claimed:

1. A phase random access memory having a memory cell array arranged with a plurality of component areas, each of the component areas comprising:

a first conductive line extending in a first direction;

a plurality of second conductive lines extending in a second direction;

a phase-changeable film electrically connected to the first conductive line;

a first semiconductor region electrically connected to the phase-changeable film and defined within a first active region; and a second semiconductor region electrically connected to the phase-changeable film, defined within a second active region and separated from the first semiconductor region by an isolation layer.

2. The phase random access memory of claim 1, wherein each of the component areas further comprises:

a first electrode connecting the first conductive line to the phase-changeable film;

a second electrode connecting the phase-changeable film to the first semiconductor region; and a third electrode connecting the phase-changeable film to the second semiconductor region.

3. The phase random access memory of claim 1, wherein each of the component areas further comprises a bitline contact through which the phase-changeable film electrically connects to the first conductive line, the bitline contact being shared by drain regions for each of a plurality of access transistors.

4. The phase random access memory of claim 1, wherein each of the component areas further comprises a plurality of third conductive lines extending in the second direction.

5. The phase random access memory of claim 4, wherein the plurality of third conductive lines are ground lines.

6. The phase random access memory of claim 1, wherein the first conductive line is a bitline and wherein each of the plurality of second conductive lines is a wordline.

7. A phase random access memory comprising:

a bitline;

a plurality of access transistors, each access transistor including a drain region; and a phase-changeable film shared by the plurality of access transistors.

8. The phase random access memory of claim 7, wherein the phase-changeable film is connected to the bitline through a first electrode and connected to each respective drain region through at least one of a plurality of second electrodes.

9. The phase random access memory of claim 8, wherein the plurality of access transistors share the first electrode.

10. The phase random access memory of claim 7, wherein a source region of each access transistor is connected to a respective ground line.

11. The phase random access memory of claim 10, wherein the drain and source regions of each access transistor are defined within an active region.

12. The phase random access memory of claim 11, wherein the active region is divided into a plurality of regions isolated from each other.

13. The phase random access memory of claim 7, wherein a source region of each access transistor is commonly connected to a ground line.

14. The phase random access memory of claim 13, wherein the ground line is shared by the source region of each access transistor.

15. The phase random access memory of claim 7, wherein the plurality of access transistors share a source region.

16. The phase random access memory of claim 7, wherein the phase-changeable film is connected to the bitline through a bitline contact shared by the drain region of each access transistor.

17. A phase random access memory having a memory cell array arranged with a plurality of component areas, each of the component areas comprising:

a first conductive line extending in a first direction;

a plurality of second conductive lines extending in a second direction;

a plurality of phase-changeable films electrically connected to the first conductive line; and a semiconductor region electrically connected to the plurality of phase-changeable films, wherein at least one phase-changeable film of the plurality of phase changeable films is electrically connected to an adjacent semiconductor region of an adjacent component area.

18. The phase random access memory of claim 17, further comprising a plurality of bitline contacts through which the plurality of phase changeable films are connected to the semiconductor region, wherein at least one bitline contact of the plurality of bitline contacts at least one phase-changeable film to the adjacent semiconductor region.

19. The phase random access memory of claim 17, further comprising a third conductive line, wherein at least one of the third conductive line and the plurality of second conductive lines are twisted.

20. The phase random access memory of claim 19, wherein the first conductive is a bitline, each of the plurality of second conductive lines is a wordline, and the third conductive line is a ground line.

* * * * *